United States Patent [19]

Watanabe et al.

[11] Patent Number: 5,139,922
[45] Date of Patent: Aug. 18, 1992

[54] METHOD OF MAKING RESIST PATTERN

[75] Inventors: Hisashi Watanabe; Yoshihiro Todokoro, both of Kyoto; Masazumi Hasegawa, Shinnanyo; Mitsutoshi Fukuda, Yamato, all of Japan

[73] Assignees: Matsushita Electronics Corporation, Kadoma; Tosoh Corporation, Shinnanyo, both of Japan

[21] Appl. No.: 602,930

[22] Filed: Oct. 25, 1990

Related U.S. Application Data

[63] Continuation of Ser. No. 179,372, Apr. 8, 1988, abandoned.

[30] Foreign Application Priority Data

| Apr. 10, 1987 | [JP] | Japan | 62-89539 |
| Apr. 10, 1987 | [JP] | Japan | 62-89541 |
| Jul. 31, 1987 | [JP] | Japan | 62-192966 |
| Jan. 18, 1988 | [JP] | Japan | 63-8099 |

[51] Int. Cl.$^5$ .................................. G03C 5/00
[52] U.S. Cl. .......................... 430/296; 430/270; 430/312; 430/327; 430/330; 430/394; 430/942; 250/492.3; 427/384
[58] Field of Search ........... 430/291, 329, 312, 326, 430/313, 315, 327, 322, 336, 324, 394, 325, 942, 328, 276, 270; 250/442.3; 427/85, 54.1, 172.2, 384, 407.1, 385.5

[56] References Cited

U.S. PATENT DOCUMENTS

| 3,245,833 | 4/1966 | Trevoy | 430/296 |
| 4,232,117 | 1/1980 | Naoi et al. | 430/530 |
| 4,283,483 | 8/1981 | Coane | 430/942 |
| 4,304,840 | 12/1981 | Helbert et al. | 430/942 |
| 4,312,935 | 1/1982 | Engler et al. | 430/325 |
| 4,599,137 | 7/1986 | Akiya | 430/296 |
| 4,699,870 | 10/1987 | Iwadate et al. | 430/942 |
| 4,701,342 | 10/1987 | Novembre et al. | 430/296 |
| 4,772,539 | 9/1988 | Gillespie | 430/942 |

FOREIGN PATENT DOCUMENTS 2064152 10/1981 United Kingdom ............... 430/942

OTHER PUBLICATIONS

"Conductive Electron-beam Resist", Japan Materials News, Mar. 1988.

Primary Examiner—Ellis P. Robinson
Assistant Examiner—Donald J. Loney
Attorney, Agent, or Firm—Cushman, Darby & Cushman

[57] ABSTRACT

A thin film of conductive high molecular compound is formed on a substrate such as Si followed by a heat treatment, and thereafter an electron beam exposure and subsequent development are made, to form pattern of the thin film of conductive high molecular compound; this method can eliminate forming of metal film to prevent the electron charge, can prevent charging of resist in electron-beam exposure or further prevent proximity effect when combined with deep ultraviolet light exposure.

14 Claims, 11 Drawing Sheets

METHOD OF MAKING RESIST PATTERN

This is a continuation of application Ser. No. 07/179,372, filed Apr. 8, 1988 is now abandoned.

FIELD OF THE INVENTION AND RELATED ART STATEMENT

1. Field of the Invention

The present invention relates to method of making resist pattern by use of electron beam exposure method, and to a electrically conductive high molecular film to be used in embodying the above method on a substrate.

2. Description of the Related Art

As sizes and widths of patterns for semiconductor devices becomes finer, use of electron beam exposure becomes common for pattern fabrication. Besides, for the purpose of improving the resolution and decreasing the adverse influence of surface topography of the substrate, use of a multi-layer structure of resist film is becoming popular. Furthermore, in electron beam exposure methods using multi-layer resist films there is a possibility of making poor pattern registration due to deflection of electron beam caused by electric charging by incident electrons of a thick underlying resist film. Accordingly, in order to prevent such mis-registration, methods of charge prevention of the underlying resist by providing a conductive Si thin film or a thin metal film of Al or Au between or adjacent to the resist film have been used.

These above-mentioned conventional methods require conductive Si thin films or metal films such as Al or Au between layers in a multi-layer structure resist, thereby requiring plasma CVD or deposition or similar steps in order to form the Si thin films or the metal films. Since these steps of forming the Si thin films or the metal thin films are of a different nature from the resist-forming process comprising spin-coatings and heat treatings, the manufacturing process including such steps becomes complicated. Furthermore, the metal film of Al, Au or the like has not only complicated steps of formation and removal, but also the possibility of contaminating the semiconductor when the substrate is of semiconductor.

Furthermore, in the electron beam exposure, a method for decreasing proximity effect, a phenomenon of causing insufficient pattern accuracy due to electron dispersion in the resist, is becoming an important problem. In order to avoid this problem, a ghost exposing method has been proposed, wherein after making a predetermined exposure by using an electron beam, a further exposure is made by using another electron beam having an obscure fringe for the portions other than the above-mentioned exposed portion.

Furthermore, since the conventional ghost method used to avoid the proximity effect requires a second electron beam exposure for all the portion of the pattern excluding the portion exposed in a first electron beam exposure, the exposure time becomes long thereby making the manufacturing process problematic in industrial efficiency.

OBJECT AND SUMMARY OF THE INVENTION

Accordingly, the purpose of the present invention is to provide a method of preventing problematic electric charging of resist film in an electron beam exposure. The present invention can form and remove a conductive film with ease and in a short time, and furthermore can form the conductive film without the possibility of contaminating the underlying semiconductor substrate.

Further, the present invention can alleviate the problem of the proximity effect.

In order to attain the above-mentioned purpose and technical advantages, a method for forming a resist pattern in accordance with the present invention comprises:

forming on a substrate a multi-layer resist film having at least one thin film of conductive high molecular compound, and exposing the multi-layer resist film to an electron-beam.

Further, the method of forming resist pattern in accordance with the present invention comprises:

forming on a substrate, a thin film of conductive high molecular compound, heat treating the thin film, exposing the heat-treated thin film to an electron beam, and developing the electron-exposed thin film, thereby producing a resist pattern of the thin film of a conductive high molecular compound.

Still further, the method of forming the resist pattern in accordance with the present invention comprises:

forming on a substrate, a film of positive type electron-beam resist, forming further thereon a thin film of ammonium poly (p-styrene sulfonate), exposing the accumulated films of the positive type electron-beam resist film and ammonium poly (p-styrene sulfonate) film to an electron beam of a predetermined pattern, developing the exposed accumulated films by water or Novorak type photoresist developer to make a pattern of the ammonium poly (p-styrene sulfonate) film, exposing the whole surface of the accumulated films to deep-ultraviolet rays, and subsequently developing the accumulated films by a developer for positive-type electron-beam resist, to make a pattern of the film of positive type electron-beam resist.

While the novel features of the invention are set forth particularly in the appended claims, the invention, both as to organization and content, will be better understood and appreciated, along with other objects and features thereof, from the following detailed description taken in conjunction with the drawings.

BRIEF DESCRIPTION OF THE DRAWING

FIG. 1A is a sectional view showing a modified example wherein a spin-on-glass (SOG) is formed between underlying conductive high molecular thin films and overriding electron-beam resist films.

DESCRIPTION OF THE PREFERRED EMBODIMENTS

Hereafter, a first preferred embodiment in accordance with the present invention is described in detail.

Figure 1A:
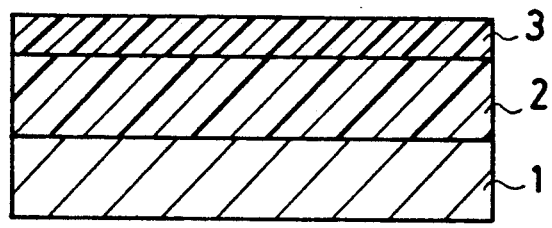
FIG. 1(a), FIG. 1(b) and FIG. 1(c) are schematic sectional views showing manufacturing flow of a resist pattern of an example in accordance with the present invention.
Figure 1B:
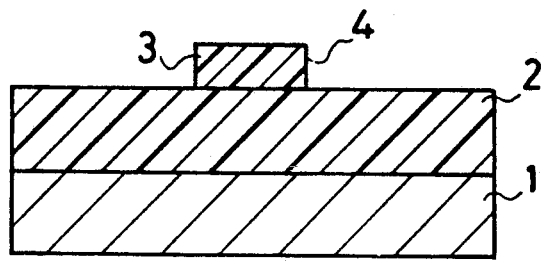
Figure 1C:
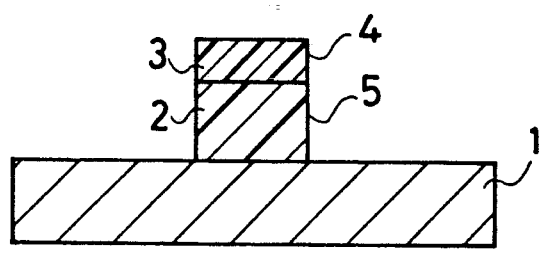
Figure 1:
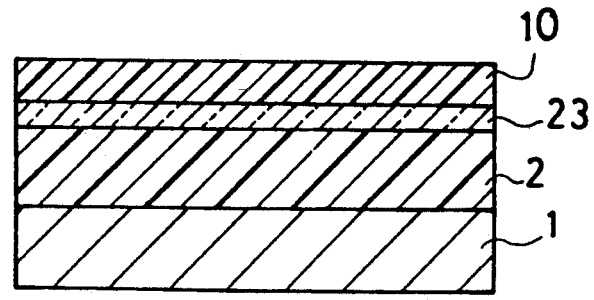

FIG. 1(a), FIG. 1(b) and FIG. 1(c) are schematic sectional views showing manufacturing flow of a resist pattern of an example in accordance with the present invention. First, as shown in FIG. 1(a), on a principal face of Si substrate 1, a thin film 2 of conductive high molecular compound, which is substantially a salt of styrene sulfonate anion and positively charged radical, for instance, ammonium poly (p-styrene sulfonate) (AmSS) in about 2 $\mu$m thickness, is coated. And subsequently, the coated film is subject to a heat treatment at 250° C. for 30 minutes. This temperature is selected so as to prevent dissolving in the organic solvent. Then, an Si-containing resist layer, for instance chloromethyl-polydiphenylsiloxane film 3 is formed by coating, and further is subject to a heat treatment at 80° C. for 30 minutes. Thus, a resist film of a two-layer structure is formed. The above-mentioned salt consisting of styrene sulfonate anion and positively charged radical, for instance the ammonium poly (p-styrene sulfonate) (AmSS), has electric conductivity, and furthermore is water-soluble. Accordingly, the compound of the film is easy to handle before coating, and is easy to coat. The film made by coating the salt serves as a film which is free from undesirable charging. Furthermore, the film can be easily removed by developing by aqueous solutions or organic solvents.

After forming the two-layer resist film in the aforementioned steps, an electron-beam exposure is carried out with the electron dose of 30 $\mu$C/cm$^2$, and subsequently a development is made by a developer solution of 5:1 mixture of diisobutylketon: ethylcyclohexane for one minute. Thereby, a resist pattern 4 of Si-containing resist film is formed as shown in FIG. 1(b).

Finally, by reactive-ion etching with O$_2$ gas, the thin film 2 of ammonium poly (p-styrene sulfonate) is etched away, thereby forming a high molecular thin film pattern 5.

The resist pattern formed by the above-mentioned steps can attain such a high registration accuracy of $\pm 0.1$ $\mu$m (in 3$\sigma$ value). In a comparable conventional art, wherein the conventional photoresist, such as positive type novorak photoresist of is used in place of the high molecular thin film 2, the registration accuracy of the resultant resist pattern is as low as only $\pm 0.7$ $\mu$m (in 3$\sigma$ value).

Figure 2:
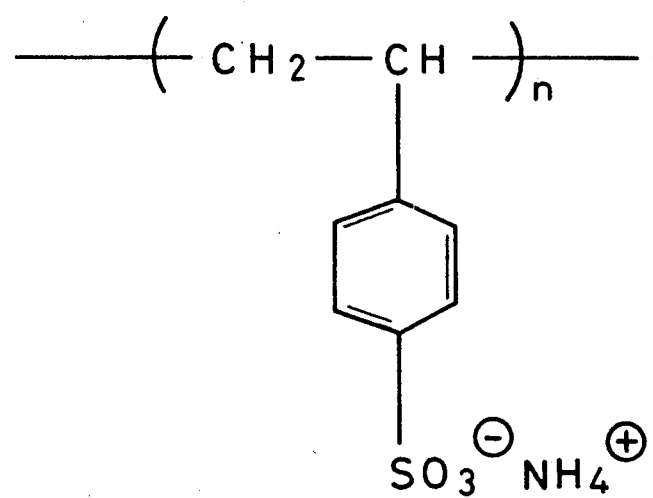
FIG. 2 is a chemical formula of ammonium poly (p-styrene sulfonate) used in the method of the present invention.

The above-mentioned ammonium poly (p-styrene sulfonate) has, as shown by it's molecular structure in FIG. 2, a styrene sulfonate anion acid and a radical having positive charge. Since the ammonium radical consists of nitrogen and hydrogen only excludes any metal, there is no fear of contaminating the semiconductor substrate, and the film is suitable in formation of resist pattern in semiconductor substrate manufacture. Of course, any other positively charged radical other than the ammonium radical may be used, as far as excluding elements of the semiconductor contaminating property.

FIG. 1A shows a modified example wherein a spinonglass (SOG) interface film 23 is formed between the underlying high molecular conductive thin film 2 and the overriding e-beam resist film 10. Then SOG layer 23 serves as transfer layer to transfer the pattern of the upper resist pattern to the underlying resist films.

Figure 3:
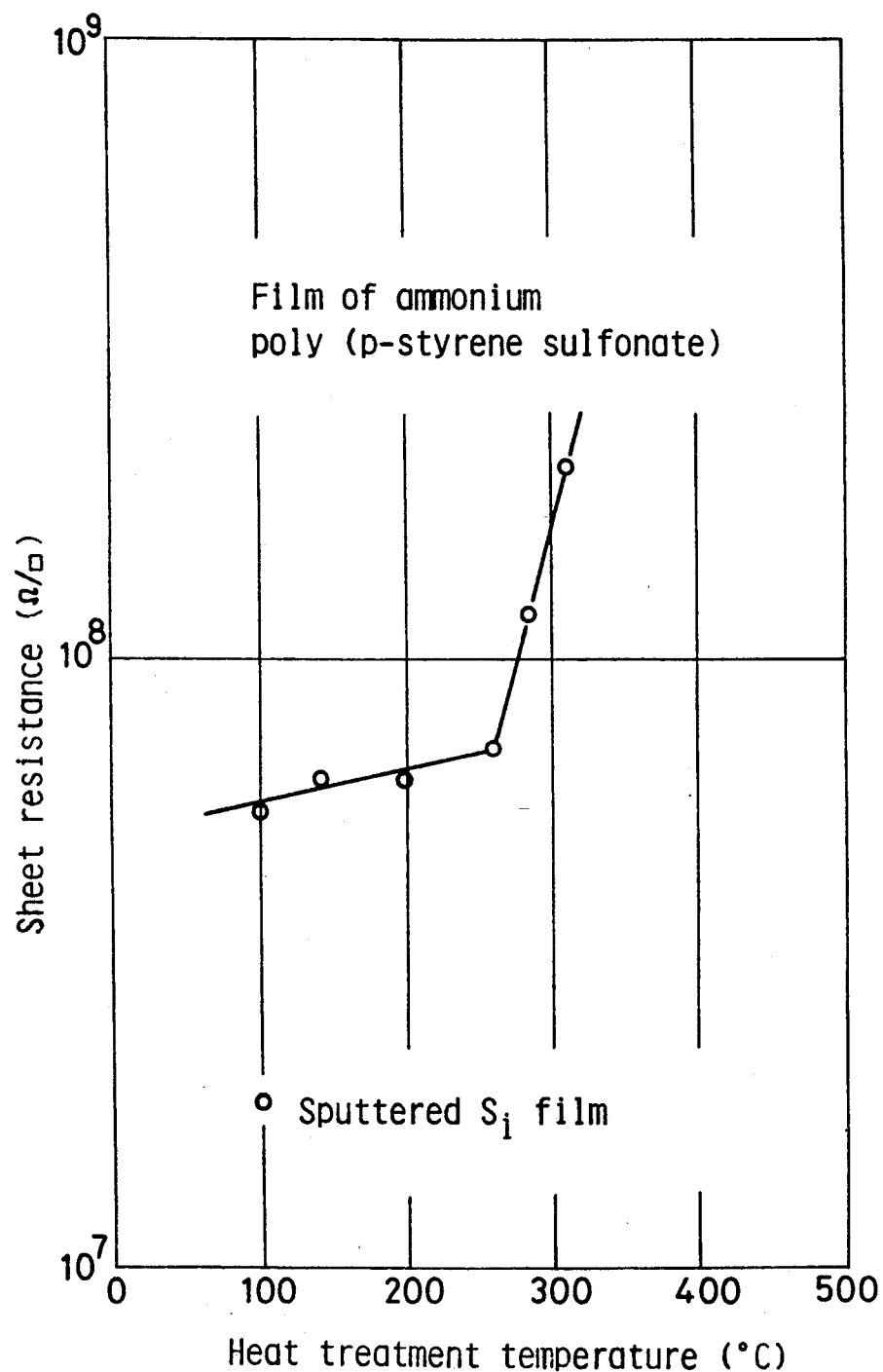
FIG. 3 is a graph showing a relation between sheet resistance ($\Omega/\square$) graduated on the ordinate axis and heat treatment temperature (°C.) graduated on the abscissa axis.

FIG. 3 is a graph showing a relation between sheet resistance ($\Omega/\square$) graduated on the ordinate axis and heat treatment temperature (°C) graduated on the abscissa. As is obvious from FIG. 3, the sheet resistance of the ammonium poly (p-styrene sulfonate) film increases as temperature of the heat treatment rises. However, at the temperature of 250° C. of the heat treatment, a sheet resistance of $7 \times 10^7 \Omega/\square$ was obtained, and this value is of a value slightly larger than the sheet resistance of Si-film formed by sputtering. In other words, a sufficiently low resistance value for discharging electrons incident at electron beam exposure was obtained, such that there is no fear of undesirable charging of the resist films by the incident electrons.

Figure 4:
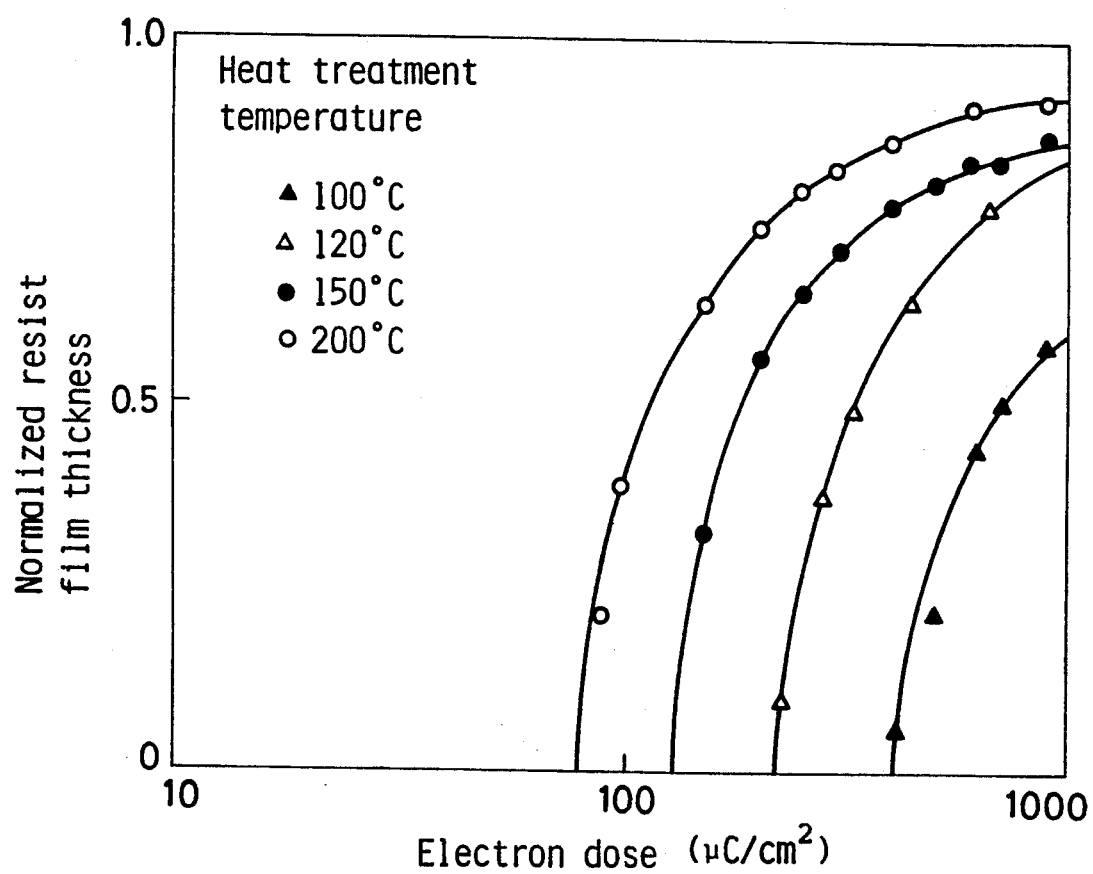
FIG. 4 is a graph showing electron-beam sensitivities of the ammonium poly (p-styrene sulfonate) films, which are heat treated at various temperatures, each followed by development with methyl alcohol or water.

The properties of the AmSS film is described in detail. FIG. 4 is a graph showing electron-beam sensitivities of the ammonium poly (p-styrene sulfonate) films, which are heat treated at various temperatures, each followed by development with methyl alcohol for 10 seconds or water for 1 minute, wherein the ordinate is graduated with normalized resist film thickness and abscissa is graduated by electron dose ($\mu$c/cm$^2$). As shown in FIG. 4, when a heat treatment temperature of 200° C. is selected, a sensitivity of 100 $\mu$C/cm$^2$ was obtained. And a value (given as gradient of the curve) of 1.5 was obtained at the portion of the curve where normalized film thickness is about half (i.e. 0.5 on ordinate).

That is to say, ammonium poly (p-styrene sulfonate) film can be utilized as a resist film, when the heat treatment temperature is selected high to raise the sensitivity. And on the other hand it can be used as a water soluble conductive film, when its sensitivity is lowered by selecting the heat treatment temperature low and at the same time the sheet resistance is lowered as shown in FIG. 3.

Figure 5A:
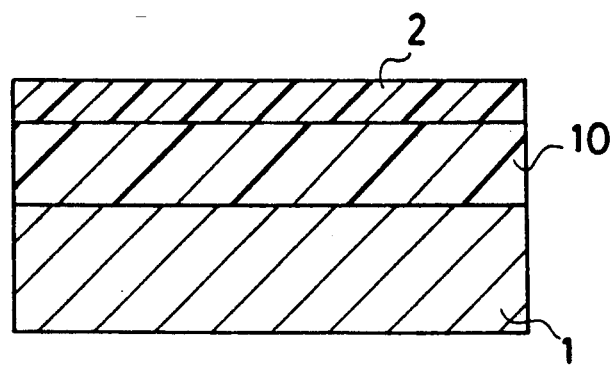
FIG. 5(a) and FIG. 5(b) are schematic sectional views showing manufacturing flow of still another example of resist pattern making in accordance with the present invention.
Figure 5B:
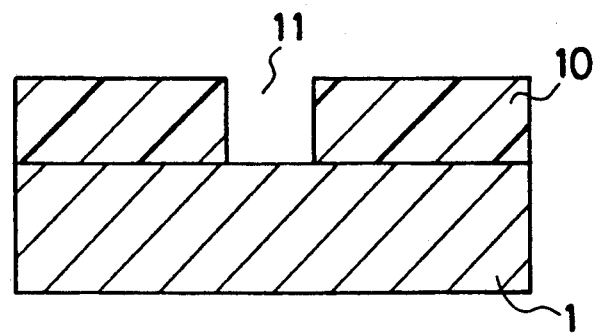

FIG. 5(a) and FIG. 5(b) show still another example of resist pattern making in accordance with the present invention. In this method, first on a principal face of a semi-insulated GaAs substrate, a polymethylmetacrylate (PMMA) film 10 as an electron beam resist film formed with a thickness of 0.5 $\mu$m, and subsequently, a pre-bake at 160° C. for 30 minutes is carried out. Next, an ammonium poly (p-styrene sulfonate) film 2 as the conductive high molecular film is formed with a thickness of 0.2 μm, and thereafter a heat treatment at 100° C. for 30 minutes is carried out, as shown in FIG. 5(a).

Next, a predetermined region is selectively exposed to an electron beam. The whole conductive high molecular thin film 2 is removed by using water or organic alkali developing solution for positive type photo resist, to carry out flood removal, and lastly, a development is made by a developer of methylisobutylketon (MIBK) to develop the electron beam resist film 10, to produce PMMA film pattern 11, as shown in FIG. 5(b).

The pattern formed in this manner has no distortion nor pattern mis-registration. In a comparison example made by simply forming resist film on the same insulated GaAs substrate without forming the ammonium poly (p-styrene sulfonate) film, the electron beam resist pattern made by electron beam exposure and the same developing process without forming the ammonium poly (p-styrene sulfonate) film, a considerable pattern distortion and pattern mis-registration are observed.

Since the ammonium poly (p-styrene sulfonate) is water-soluble, the film can be formed easily on the PMMA film, and furthermore, it can be coated on other various resist film than PMMA without undesirable mixing around interfaces therebetween. Furthermore, since the ammonium poly (p-styrene sulfonate) can be easily removed by organic alkaline developer or water, there is no fear that the PMMA film or other electron beam resist suffers undesirable influence by the development.

Figure 8A:
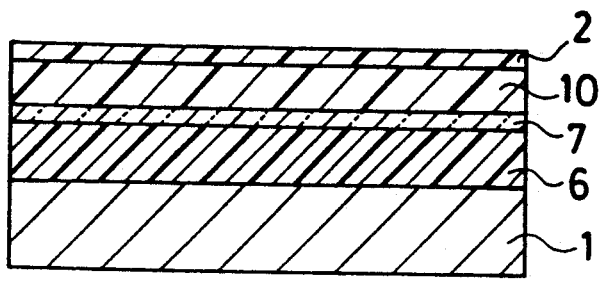
FIG. 8(a), FIG. 8(b) and FIG. 8(c) are sectional views showing manufacturing flow of still another example of the invention.
Figure 8B:
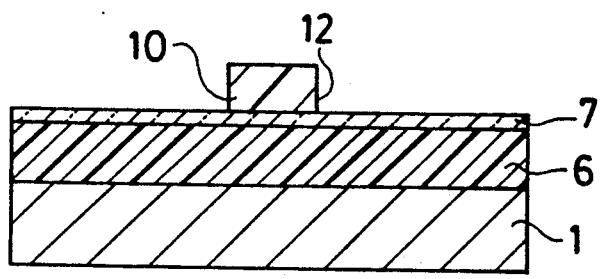
Figure 8C:
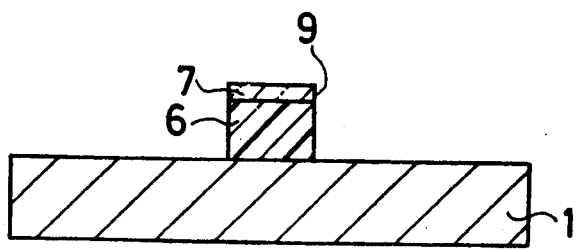

FIG. 8(a), FIG. 8(b) and FIG. 8(c) are sectional views showing manufacturing flow of still another example of the invention wherein on a silicon substrate 1 a four-layer resist film including an ammonium poly (p-styrene sulfonate) film as the top layer is formed, and patterning is made on the resist film.

In this example, first a silicon substrate 1 is prepared, and a positive type resist film of Novorak type is formed with a thickness of about 2 μm, and subsequently a heat treatment is carried out at a temperature of 270° C. for 30 minutes. Next, a spin-on-glass film (SiG) 7 is coated with a thickness of 0.2 μm, and a heat treatment is made at a temperature of 250° C. for 30 minutes. Subsequently, as an electron beam resist film 10, a chloromethylpolystyrene film is formed with a thickness of 0.5 μm, and thereafter a pre-baking at a temperature of 125° C. for 30 minutes is performed, and thereon a conductive high molecular thin film 2 of ammonium poly (p-styrene sulfonate) film is formed with a thickness of 0.2 μm, and a heat treatment is carried out at a temperature of 100° C. for 30 minutes, as shown in FIG. 8(a).

Thereafter, an electron beam exposure is made with exposure amount of 6 μC/cm$^2$, and then the ammonium poly (p-styrene sulfonate) film is removed by using water. Thereafter, by a developer of a 1:4 mixture of isoamyl acetate and ethylcellosolve, the chloromethylpolystyrene film is developed, thereby forming an electron beam resist pattern 12 as shown in FIG. 8(b).

Finally, by using the electron beam resist pattern 12 of the chloromethylpolystyrene film as a mask, the spin-on-glass film 7 is selectively removed by means of CHF$_3$/O$_2$ plasma etching; and further by using the spin-on-glass film 7 as mask, a plasma etching process is carried out to etch the organic thin film 6 to obtain a desired pattern 9, as shown in FIG. 8(c).

In the pattern formed by the method in accordance with this embodiment, a high registration accuracy of ±0.1 μm (in 3σ) is obtained.

Figure 6A:
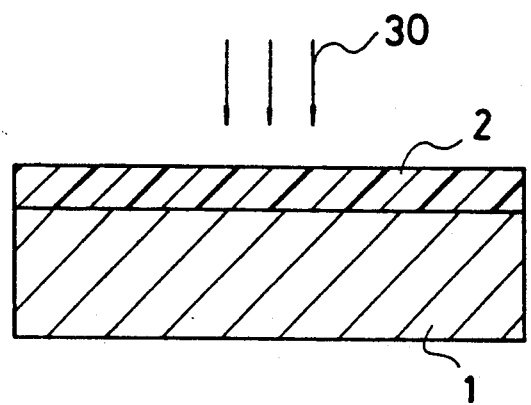
FIG. 6(a) and FIG. 6(b) are sectional views showing manufacturing flow of still another example.
Figure 6B:
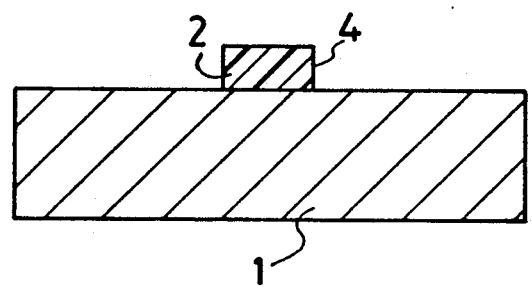

FIG. 6(a) and FIG. 6(b) are sectional views showing manufacturing flow of another example. This example is based on a finding that the ammonium poly (p-styrene sulfonate) itself works as resist film to electron-beam exposure, besides the work as a conductive film.

In FIG. 6(a), on a principal face of a semi-insulative GaAs substrate 1, a conductive high molecular thin film 2 of ammonium poly (p-styrene sulfonate) (AmSS) film is formed. Forming of this thin film is made by rotary coating of aqueous solution of ammonium poly (p-styrene sulfonate) at 4,000 rpm, followed by heat treatment in nitrogen (N$_2$) atmosphere of 200° C. for 30 minutes. Then, by using an electron beam 30 of acceleration voltage of 25 KV, an electron beam exposure is made to an amount of 120 μC/cm$^2$, as shown in FIG. 6(a). Thus, a predetermined pattern is exposed, and the thin film thus exposed to the electron beam is subject to development by methyl alcohol for 10 seconds, to form a pattern 4, as shown in FIG. 6(b).

The pattern of the resist film formed by the above-mentioned steps has no substantial mis-registration. In a comparison example wherein the conventional resist of polymethylmetacrylate (PMMA) is formed on the same substrate of semi-insulated GaAs, and the same electron beam exposure and development were made, a great distortion of pattern and mis-registration were observed.

Figure 7A:
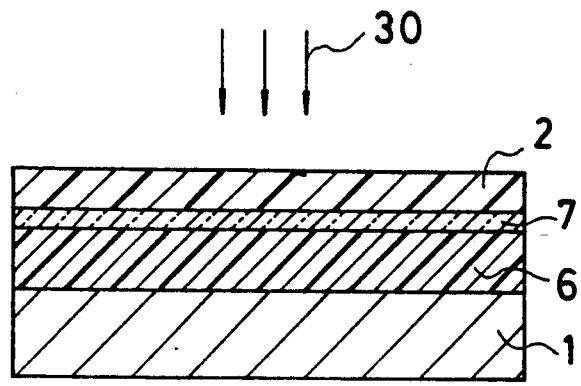
FIG. 7(a), FIG. 7(b) and FIG. 7(c) are sectional views showing manufacturing flow of still another example.
Figure 7B:
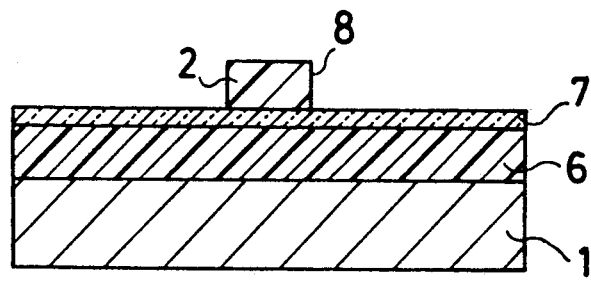
Figure 7C:
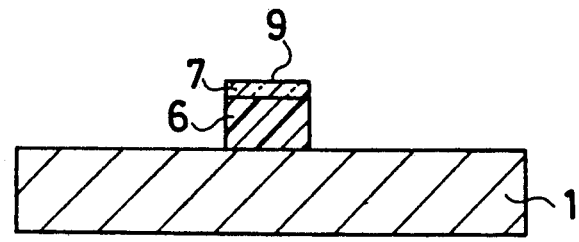

FIG. 7(a), FIG. 7(b) and FIG. 7(c) show yet another example wherein, on a silicon substrate 1, a three-layer resist having top layer of an ammonium poly (p-styrene sulfonate) film is formed.

In this example, on a silicon substrate 1, a positive type novorak film is formed as an organic thin film 6 with a thickness of 2 μm, followed by a heat treatment at 270° C. for 30 minutes. Subsequently, a spin-on-glass film (SOG) 7 is formed with 0.2 μm thickness, and a heat treatment at 250° C. is carried out for 30 minutes. Further thereon, an ammonium poly (p-styrene sulfonate) film is coated with a thickness of 0.5 μm as shown in FIG. 7(a), and a heat treatment at 200° C. is carried out for 30 minutes.

Next, exposure to an electron beam 30 is made at an amount of 120 μC/cm$^2$, and development is done using methyl alcohol, thereby forming a conductive high molecular film pattern 8 as shown in FIG. 7(b). Thereafter, by using the conductive high molecular film pattern as a mask, the spin-on-glass film 7 is selectively removed by CHF$_3$/O$_2$ plasma etching. Subsequently, by utilizing the selectively etched spin-on-glass film 7 as a mask, the underlying organic thin film 6 is etched by using O$_2$ plasma etching, thereby forming a final pattern 9 as shown in FIG. 7(c).

The pattern manufactured by the above-mentioned process has a high registration accuracy of ±0.1 μm (3σ). When a top layer of a conventional electron beam resist in the conventional three-layer resist film is used, the pattern made by making electron beam exposure therewith makes a considerable mis-registration due to charging, thereby resulting in a low registration accuracy of ±0.7 μm (3σ).

The ammonium poly (p-styrene sulfonate) makes its sensitivity high when the heat treatment temperature is high as shown in FIG. 4, but the conductivity thereof becomes low as shown in FIG. 3. Accordingly, the heat treatment temperature after the coating of the ammonium poly (p-styrene sulfonate) film can not be determined by only its sensitivity. That is, the heat treatment temperature should be selected at such one that does not induce any obstacle in making normal patterning due to lowering of the conductivity. On the other hand, sensitivity of AmSS against electron beam exposure is determined by heat treatment temperature made after the exposure, and the sensitivity is raised by selecting a higher temperature. Therefore, by selecting the heat treatment temperature after the coating low followed by another heat treatment at a higher temperature after the exposure, the sensitivity can be raised without lowering the conductivity.

According to the above-mentioned method, the electron beam exposure without undesirable charging of the resist film becomes possible.

Utilization of the ammonium poly (p-styrene sulfonate) film can substantially eliminate proximity effect of an electron beam resist, thereby enabling further improvement of the pattern accuracy as is elucidated in the example shown in FIG. 9(a), FIG. 9(b), FIG. 9(c) and FIG. 9(d).

Figure 9A:
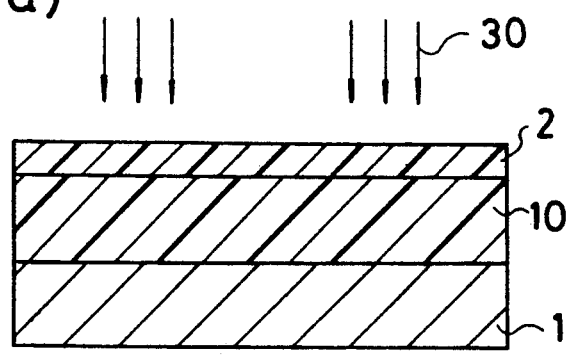
FIG. 9(a), FIG. 9(b), FIG. 9(c) and FIG. 9(d) are sectional views showing manufacturing flow of still another example of the invention utilizing AmSS film to the proximity effect.
Figure 9B:
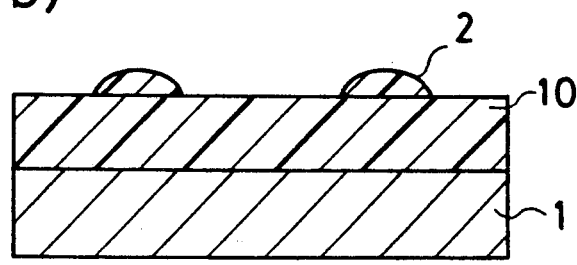
Figure 9C:
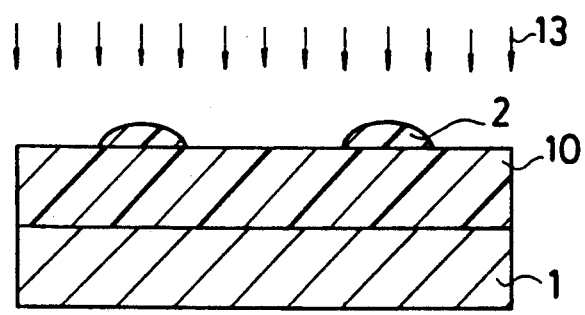
Figure 9D:
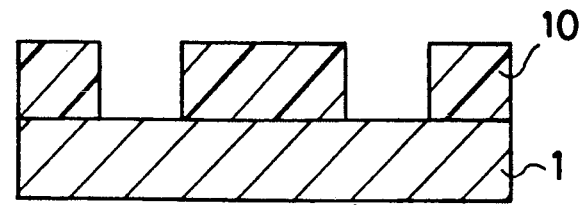
Figure 10:
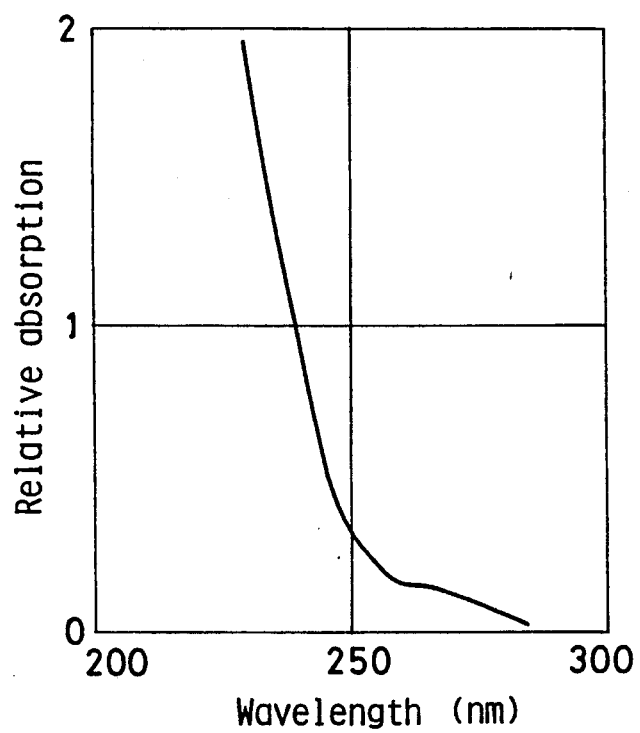
FIG. 10 is a graph showing spectral distribution of relative absorption of an AmSS film.

As shown in FIG. 9(a), on a principal face of an Si substrate 1, a polymethylmetacrylate (PMMA) film 10 is formed as an electron beam resist film, and further thereon an ammonium poly (p-styrene sulfonate) (AmSS) film 2 is formed. The PMMA film 10 was coated to a thickness of 0.5 $\mu$m and pre-baked at a temperature of 170° C. for 30 minutes; and the AmSS film 2 is coated to a thickness of 0.2 $\mu$m and pre-baked at a temperature of 160° C. for 30 minutes. After forming these two films, an electron beam exposure is made by means of electron beam 3 with the electron dose of 150 $\mu$C/cm$^2$ of a predetermined pattern. The AmSS film 2 has a negative type sensitivity as shown in the sensitivity curve of FIG. 4 against the electron beam exposure. Therefore developing the AmSS film 2 using by water as developer, a negative type pattern shown in FIG. 9(b) is formed. Further, in place of water, a known developing solution for Novorak type photoresist can be used, too. As is known, the side walls in sectional view of the negative type photoresist becomes an inclined wall in place of a vertical wall. The PMMA film 10 is not influenced at all since it is not dissolved by water used as the developer for the AmSS film 2. Next, as shown in FIG. 9(c), the whole surface of the substrate is exposed to deep-ultraviolet collimated light of 250 nm wavelength. Since, the AmSS film 2 has strong absorption in the deep-ultraviolet light region as shown in FIG. 10, it works as mask against the deep-ultraviolet light. Furthermore, since the side walls of the pattern of AmSS film 2 becomes inclined wall, a portion of the deep-ultraviolet light 13 passes thinner parts at the skirts of the inclined wall of the AmSS film. Thus the same effect as exposing by electron beams of much blurred edge other than the desired pattern portion is achieved. Thereafter, by developing the PMMA film 10 by a developer prepared by mixing methylisobutylketon and isopropylalcohol in a ratio of 1:3, a desired pattern compensated of the proximity effect as shown in FIG. 9(d) is produced.

In the above-mentioned resist pattern making by use of AmSS film as the conductive high molecular film, coating the AmSS film thinly and uniform thick is an important matter. This can be achieved by carrying out spin coating process, such as applying a solution prepared by dissolving ammonium poly (p-styrene sulfonate) in water or methylalcohol on the substrate followed by the heat treatment.

Figure 11:
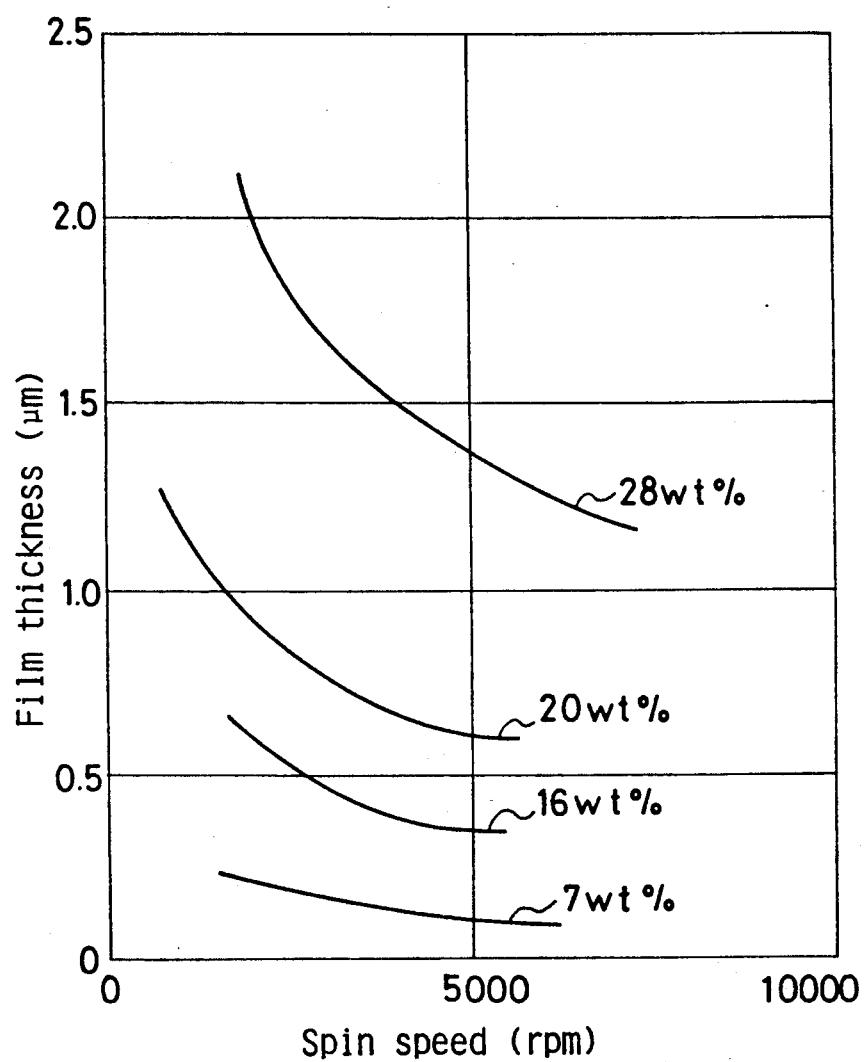
FIG. 11 is a graph showing the relation between spin-speed and film thickness of an AmSS film coated by spin-coating process.

FIG. 11 shows a relation between spin speed (graduated on abscissa) and film thickness (graduated on ordinate) when the aqueous solution of ammonium poly (p-styrene sulfonate) (AmSS) is coated on the substrate by the spin coating process.

When the condition is selected such that the amount of AmSS is between 5 wt % and 30 wt % and the spin speed is between 1000 rpm and 7000 rpm, a uniform AmSS film of thickness between 0.1 $\mu$m and 2 $\mu$m can be made. As is understood from the graph, as the amount of AmSS in the solution, hence its wt %, rises, or as the spin speed decreases, the resultant film becomes thick. But, when the weight percentage of AmSS in the solution is above 30%, the striation in the spin-coating becomes too large. On the other hand, when the spin speed is lower than 1000, the striation also becomes too large. Furthermore, when the spin speed is over 7000 rpm, holding of the substrate in the spin coating process becomes difficult.

Atomic absorption analysis of the obtained AmSS film proved that impurity metals contained in the semiconductor substrate is lower than 1 ppm.

As the solvent to dissolve AmSS, water, methylalcohol or dimethylsulfo-oxido (DMSO) was especially preferable.

According to the method of forming resist pattern of the present invention, the GHOST method can be carried out by a combination of only one-time electron beam exposure and subsequent whole-area exposure to deep-ultraviolet rays. Therefore, time required for electron beam exposure is shortened, and the proximity effect can be decreased.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A method for making a resist pattern comprising the steps of:
   forming on a substrate a multi-layer resist film having at least one thin film of a conductive high molecular compound which is substantially a salt consisting of styrene sulfonate anion and a radical having a positive charge; and
   exposing said multi-layer resist film to an electron-beam;
   wherein said thin film is made of ammonium poly (p-styrene sulfonate) and is formed by a spin coating method using a solution prepared by dissolving ammonium poly (p-styrene sulfonate) in water or methyl alcohol or a mixture of water and methyl alcohol followed by heat treatment.

2. A method for making a resist pattern comprising the steps of:
   forming on a substrate a multi-layer resist film having at least one thin film of a conductive high molecular compound which is substantially of ammonium poly (p-styrene sulfonate); and
   exposing said multi-layer resist film to an electron-beam;
   wherein said thin film is made of ammonium poly (p-styrene sulfonate) and is formed by a spin coating method using a solution prepared by dissolving ammonium poly (p-styrene sulfonate) in water or methyl alcohol or a mixture of water and methyl alcohol, followed by heat treatment.

3. Method for making a resist pattern in accordance with claim 1 or 2, wherein
the concentration of ammonium poly (p-styrene sulfonate) in said solution is below 30 wt %.

4. Method for making resist pattern comprising the steps of:
forming on a substrate, a film of positive type electron-beam resist,
forming further thereon a thin film of ammonium poly (p-styrene sulfonate),
exposing accumulated films of said positive type electron-beam resist film and ammonium poly (p-styrene sulfonate) film to electron beam of a predetermined pattern,
developing said exposed accumulated films by water or Novorak type photoresist developer to make a pattern of said ammonium poly (p-styrene sulfonate) film,
exposing the whole surface of said accumulated films to deep-ultraviolet rays, and
subsequently developing the accumulated films by a developer for positive-type electron-beam resist, to make a pattern of said film of positive type electron-beam resist.

5. Method for forming a resist pattern comprising the steps of:
forming on a substrate, a thin film of conductive high molecular compound which is substantially of ammonium poly (p-styrene sulfonate),
heat treating said thin film,
exposing said heat-treated thin film to an electron beam, and
developing said electron-exposed thin film, thereby producing a resist pattern of said thin film of conductive high molecular compound.

6. Method for making a resist pattern in accordance with claim 4 or 5, wherein
said thin film of ammonium poly (p-styrene sulfonate) is formed by a spin coating method using a solution prepared by dissolving ammonium poly (p-styrene sulfonate) in water or methyl alcohol or mixture of water and methyl alcohol, followed by heat treatment.

7. Method for making a resist pattern in accordance with claim 6, wherein
the concentration of ammonium poly (p-styrene sulfonate) in said solution is below 30 wt%.

8. A method for making a resist pattern comprising the steps of:
forming on a substrate a multi-layer resist film having at least one thin film of a conductive high molecular compound which is substantially a salt consisting of a styrene sulfonate anion and a radical having a positive charge;
wherein said multi-layer resist film is formed by the steps of:
forming said one thin film of conductive high molecular compound on said substrate;
forming a Si-containing resist film on said thin film of conductive high molecular compound; exposing said multi-layer resist film to an electron beam to form a desired pattern; and
thereafter selectively removing, the desired pattern made by said exposing to form a final pattern.

9. A method for making a resist pattern comprising the steps of:
forming on a substrate a multi-layer resist film having at least one thin film of a conductive high molecular compound which is substantially of ammonium poly (p-styrene sulfonate);
wherein said multi-layer resist film is formed by the steps of:
forming said one thin film of conductive high molecular compound on said substrate;
forming a Si-containing resist film on said thin film of conductive high molecular compound;
exposing said multi-layer resist film to an electron beam to form a desired pattern; and
thereafter selectively removing, the desired pattern made by said exposing to form a final pattern.

10. A method for making a resist pattern comprising the steps of:
forming on a substrate a multi-layer resist film having at least one thin film of a conductive high molecular compound which is substantially a salt consisting of styrene sulfonate anion and a radical having a positive charge;
wherein said multi-layer resist film is formed by the steps of:
forming said one thin film of conductive high molecular compound on said substrate;
forming a spin-on-glass film on said one thin film;
forming an electron-beam resist film on said spin-on-glass film;
exposing said a multi-layer resist film to an electron beam; and
thereafter selectively removing from at least said electron beam resist film to produce a desired pattern made by said exposing.

11. A method for making a resist pattern comprising the steps of:
forming on a substrate a multi-layer resist film having at least one thin film of a conductive high molecular compound which is substantially of ammonium poly (p-styrene sulfonate);
wherein said multi-layer resist film is formed by the steps of:
forming said one thin film of conductive high molecular compound on said substrate;
forming a spin-on-glass film on said one thin film;
forming an electron-beam resist film on said spin-on-glass film;
exposing said multi-layer resist film to an electron beam; and
thereafter selectively removing from at least said electron beam resist film to produce a desired pattern made by said exposing.

12. A method for making a resist pattern comprising the steps of:
forming on a substrate a multi-layer resist film having at least one thin film of a conductive high molecular compound which is substantially a salt consisting of styrene sulfonate anion and a radical having a positive charge;
wherein said multi-layer resist film is formed by the steps of:
forming an electron-beam resist film on said substrate;
forming said one thin film of conductive high molecular compound on said electron-beam resist film;
heat treating the resultant multi-layer resist film;
exposing said resultant multi-layer resist film to said electron beam; and
thereafter performing flood removal on said thin film of conductive high molecular compound and subsequently performing selective removal on said electron beam resist to produce a desired pattern made by said exposing.

13. A method for making a resist pattern comprising the steps of:
   forming on a substrate a multi-layer resist film having at least one thin film of a conductive high molecular compound which is substantially of ammonium poly (p-styrene sulfonate);
   wherein said multi-layer resist film is formed by the steps of:
      forming an electron-beam resist film on said substrate;
      forming said one thin film of conductive high molecular compound on said electron-beam resist film;
      heat treating the resultant multi-layer resist film;
      exposing said resultant multi-layer resist film to said electron beam; and
      thereafter performing flood removal on said thin film of conductive high molecular compound and subsequently performing selective removal on said electron beam resist to produce a desired pattern made by said exposing.

14. Method of forming a resist pattern comprising the steps of:
   forming on a substrate, a thin film of conductive high molecular compound which is substantially a salt consisting of styrene sulfonate anion and radical having a positive charge,
   heat treating said thin film,
   exposing said heat-treated thin film to an electron beam, and
   developing said electron-exposed thin film, thereby producing a resist pattern of said thin film of conductive high molecular compound.

* * * * *